Figure 1A:
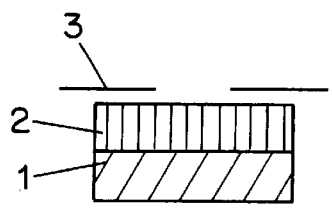

United States Patent [19]
Bennett et al.

[11] Patent Number: 6,087,073
[45] Date of Patent: Jul. 11, 2000

[54] PRODUCTION OF WATER-LESS LITHOGRAPHIC PLATES

[75] Inventors: Peter Andrew Reath Bennett, Harrogate; Carole-Anne Smith, Morley, both of United Kingdom

[73] Assignee: Kodak Polychrome Graphics L.L.C., Norwalk, Conn.

[21] Appl. No.: 08/875,004

[22] PCT Filed: Nov. 28, 1995

[86] PCT No.: PCT/GB95/02782

§ 371 Date: Sep. 18, 1997

§ 102(e) Date: Sep. 18, 1997

[87] PCT Pub. No.: WO96/20433

PCT Pub. Date: Jul. 4, 1996

[30] Foreign Application Priority Data

Dec. 23, 1994 [GB] United Kingdom .................. 9426204

[51] Int. Cl.⁷ .................................................. G03F 7/22
[52] U.S. Cl. .................... 430/303; 430/156; 430/166; 430/328; 430/329; 430/394; 101/465; 101/467
[58] Field of Search .................... 430/156, 166, 430/303, 328, 329, 394; 101/465, 467

[56] References Cited

U.S. PATENT DOCUMENTS

| | | | |
|---|---|---|---|
| 3,910,187 | 10/1975 | Cords | 101/450 |
| 4,564,584 | 1/1986 | Fredericks et al. | 430/312 |
| 4,853,313 | 8/1989 | Mori et al. | 430/156 |
| 5,635,328 | 6/1997 | Higashino et al. | 430/166 |

FOREIGN PATENT DOCUMENTS

| | | | |
|---|---|---|---|
| 157 125 | 10/1982 | Germany | G03F 7/02 |
| 200 108 | 3/1983 | Germany | G03F 7/02 |
| 58-018634 | 2/1983 | Japan | G03F 7/02 |

OTHER PUBLICATIONS

IBM Technical Disclosure Bulletin, vol. 19, No. 10, Mar. 1977, New York, U.S., p. 4014.

*Primary Examiner*—Bernard Codd
*Attorney, Agent, or Firm*—Baker Botts, L.L.P.

[57] ABSTRACT

There is described a method of preparing a water-less lithographic plate by coating a positive working photosensitive composition onto an oleophilic base imagewise exposing the plate and developing it to remove the areas of the photosensitive composition which have been light exposed, coating overall the surface of the plate with a layer of a composition which is ink-releasing or when cured becomes ink releasing, then either as a separate step or as a combined step curing the ink-releasing composition or drying the ink-releasing composition and light exposing overall the plate, then redeveloping the plate to remove the photosensitive composition remaining after the first development and any ink-releasing composition overlying the photosensitive composition.

28 Claims, 2 Drawing Sheets

PRODUCTION OF WATER-LESS LITHOGRAPHIC PLATES

This invention relates to the production of so-called water-less lithographic plates.

Lithographic plates may be divided into two classes. Those which require dampening water which is fed to the non-image areas of the plate, forms a water film and acts as an ink-repellant layer; this is the so-called fount solution and those which require no fount solution are called driographs or water-less lithographic plates. Most lithographic plates at present in use are of the first type and require a fount-solution during printing. However, lithographic plates of this type suffer from a number of disadvantages. Some of these are:

a) adjustment of the proper ink-water balance during press operation is difficult and requires great experience. If the correct ink-water balance is not achieved scumming is occasioned when the printed ink image extends into the non-image areas ruining the printed image.

b) adjustment of the ink-water balance at start-up or re-start up is particularly difficult and can not be stabilised until a large number of sheets have been printed, thus incurring waste, c) the ink tends to become emulsified which leads to poor adherence of the ink on to the plate which causes problems in colour reproduction and in dot reproduction, d) the printing press has to be provided with a dampening system, thus increasing its size and complexity.

e) The plate care chemistry and fount solutions require careful control and selection. Further plate cleaners contain significant levels of solvent which is not desirable.

However, with water-less plates in which the ink-releasing layer is, for example, a cured silicone layer there is no scumming and clearer images can be produced. Very often water-less plates comprise a base material, for example aluminium plate, on which a photosensitive layer is coated, on this photosensitive layer there is coated a silicone layer. After imagewise exposure and development in which selected areas of the photosensitive composition are altered, the overlying silicone layer is removed and the plate is inked up. The ink adheres only to those areas of the plate not covered by the silicone remaining after development. Thus the plate can be printed without the need to use a fount solution.

However, in practice it has proved difficult to get the silicone layer composition to adhere to the photosensitive layer. In spite of the idea of water-less plates having been described in patent specifications for at least fifteen years very little has been done to commercialise the idea and water-less plates which have been and are being sold are more expensive than the conventional plates which require a fount solution.

It is the object of the present invention to provide a novel method of preparing a water-less lithographic plate.

Therefore, according to the present invention there is provided a method of preparing a water-less lithographic plate by coating a positive working photosensitive composition onto an oleophilic base, imagewise exposing the plate and developing it to remove the areas of the photosensitive composition which have been light exposed, coating overall the surface of the plate with a layer of a composition which is ink releasing, or when cured becomes ink releasing, then either as a separate step or as a combined step, curing the ink releasing composition or drying the ink releasing composition and light exposing overall the plate, then redeveloping the plate to remove the photosensitive composition remaining after the first development and the ink releasing composition which overlaid it.

In order to minimise the possibility of the ink releasing substance remaining on the positive working composition after the redevelopment step an additional step between first developing step and coating overall the plate with the ink-releasing substance may be employed, which comprises treating the plate with an oleophilic coating composition which adheres to the remaining positive working composition but which does not adhere to the exposed base to form a thin optically light transparent coating on the remaining positive working composition. The ink-releasing substance does not adhere to this thin coating.

Suitable oleophilic substances to use are esters based on coconut fatty acid. Such substances are wiped on the plate after the first developing step to provide a very thin layer.

In one method of the present invention the ink-releasing composition is cured in a separate step. For example the ink-releasing composition may be heat curable.

In an alternative method of the present invention the ink-releasing composition is U.V. light curable. Thus in this method a single step only is required to cure the ink-releasing composition and to overall expose the plate.

In another method of the present invention the ink-releasing composition is initially ink-releasing but requires to be dried.

The method of the present invention yields a positive working water-less lithographic plate in which the ink releasing composition remaining on the plate constitutes the oleophobic or ink releasing areas of the plate, whilst the areas of the plate from which the photosensitive composition was removed by the second development step constitutes the oleophilic areas of the plate.

After the second development step and drying, the plate can be inked up. The ink is held in the areas between the portions of ink releasing composition which remain on the plate. No fount solution is required to differentiate between the oleophilic and the ink releasing areas of the plate when printing using an oleophilic printing ink.

The oleophilic base used in the method of the present invention is preferably an aluminium plate which will carry on its surface a thin aluminium oxide layer due to action with atmospheric oxygen. This layer may be of increased thickness due to anodising treatment of the base. Post anodic treatment of the base to increase its oleophilicity may be undertaken. This treatment following electrochemical graining provides a conventional litho base which may be used in the method of the present invention.

Alternatively the aluminum base may be an ungrained base which has been anodised and then optionally silicated. For example the following method may be used.

A solution of 3% sodium silicate was made up in deionised water. This was heated to a temperature of 50° C. in a waterbath. The anodised only substrate was immersed for 30 seconds before being washed thoroughly and placed into an 80° C. oven for 5 minutes.

A particularly useful base is obtained when the ungrained but anodised aluminium base is silicated as above and then coated with for example δ-aminopropyltrimethoxysilane.

A particularly useful coating solution is a 1:990 solution of δ-aminopropyltrimethoxysilane in n-heptane.

Alternatively or in addition the aluminium base may have been coated with a layer which gives the coated base improved oleophilicity over the uncoated base. Examples of such coatings are a negative working photosensitive composition or an oleophilic polymer for example ethyl cellulose or a resol type resin.

The coating over the aluminium base plate whether treated or not may be coated with a so-called primer layer as described for example in E.P. 44220, U.S. Pat. No. 5,061, 598 and E.P. 560347. Such primer layers may comprise a large variety of polymers such as polyester, polyurethanes and polyamides and help to provide a better printing surface than is afforded by uncoated aluminium.

Another base material which may be used in the method of the present invention is a plastics material base or a treated paper base as used as base in the photographic industry. A particularly useful plastics material base is polyethylene terephthalate which has been subbed to render its surface oleophilic. A so-called resin coated paper which has been corona discharge treated may also be used.

Preferably the ink releasing composition is a silicone based polymer.

Other substances which can be used instead of silicone based polymers in the ink-releasing composition include fluoro-alkyl compounds as described in U.S. Pat. No. 3,910, 187, U.S. Pat. No. 4,424,325, U.S. Pat. No. 4,087,584 and U.S. Pat. No. 4,724,195.

Examples of useful silicone polymers are organo functional siloxanes. One such siloxane is available from Dow Corning as a 40% solids emulsion under the designation SYL OFF 7920.

Usefully a curing catalyst may be used in conjunction with the ink-releasing composition. For example a platinum based catalyst marketed by Dow Corning under the designation SYL OFF 7922 may be used to cure SYL OFF 7920.

A useful siloxane coating composition for use of the method of the present invention comprises:

4 parts by weight of SYL OFF 7920
1 part by weight of SYL OFF 7922
2 parts by freight of water This is hereinafter referred to as siloxane coating composition A.

Another useful silicone for use as release agent which is coated as an organic solvent based formulation comprises 0.375 g (viscosity 500 ctsk) polydimethyl siloxane vinyl dimethyl terminated, 0.105 g methylhydrodimethyl siloxane co-polymer +1 drop of platinum divinyl tetramethyl disiloxane (catalyst) in 1.53 g of isopar G: toluene. (14:2.5) ratio.

Preferably the ink-releasing composition comprises a proportion of a water soluble polymer for example polyvinyl alcohol or a cellulose ether such as hydroxy propyl cellulose.

A modified siloxane composition for use in the present invention comprises:

4 parts by weight of SYL OFF 7920
1 part by weight of SYL OFF 7922
2 parts by weight of aqueous solution which comprise
   10% by weight of polyvinyl alcohol of (Gohsenol NM 14)

This siloxane composition is hereafter referred to as siloxane coating composition B.

When the ink-releasing coating composition comprises a catalyst such as SYL OFF 7922 which contains platinum the composition is heat-curable at temperatures over 100° C. Thus when such an ink-releasing coating composition is used a separate ink-releasing composition curing step is required. Examples of other platinum based catalysts are described in E.P. 560347.

Usefully the ink-releasing composition curing catalyst may be present coated on or in the oleophilic base. Thus curing of the composition takes place preferentially in those areas of the plate from which the photosensitive composition has been removed after the first developing step.

Other ink-releasing coating compositions are curable by U.V. exposure if they comprise an initiator which is activated by U.V. Such initiators are described in U.S. Pat. No. 3,865,588, and include aromatic ketones, hexaarylbiimidazoles and pyrilium salts.

Such initiators may also be present coated on or in the oleophilic base.

An example of a fluoro-alkyl compound composition which is U.V. curable comprises

| Zonyl TM | 1 g |
| Zonyl TA-N | 2 g |
| Irgacure 907 | 0.1 g |
| Methyl Ethyl Ketone | 2 g |

This fluoro-alkyl compound composition is hereinafter referred to as fluoroalkyl coating composition C. The Zonyl products are marketed by Du Pont, the Irgacure is marketed by Ciba-Geigy.

An example of a fluoro compound composition which is initially ink-releasing but in use requires to be air dried at about 100° C. is a 17% by weight of ZONYL 8070 dispersed in water. ZONYL is a fluoro alkyl polymer marketed by Du Pont.

This is hereinafter referred to as fluoroalkyl coating composition D.

Usefully a curing inhibitor may be present in the positive layer. This reduces the amount of ink-releasing composition which adheres to the positive photosensitive composition areas which are left after the first development and exposure. This aids in the complete removal of such positive areas after the second exposure and development. An example of a suitable curing inhibitor is hydroquinone.

In order to reduce the amount of ink releasing composition which sticks to the positive photosensitive composition left after the first development the binder for this photosensitive composition may comprise at least one cellulosic compound such as ethyl cellulose.

Depending on the optical sensitivity of the photosensitive composition the imagewise exposure may be a contact exposure, a projection exposure or an exposure in an image setter to an electromagnetic radiation or heat source, typically a scanning laser.

Preferably the positive working photosensitive composition comprises an 0-quinone diazide compound.

Examples of particularly preferred o-quinone diazide compounds are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709 and 3,647,443 and these compounds may preferably be used in the invention. Among these, particularly preferred are o-naphthoquinonediazidosulfonates or o-naphthoquinonediazidocarboxylates of aromatic hydroxyl compounds; o-naphthoquinonediazidosulfonic acid amides or o-naphthoquinonediazido- carboxylic acid amides of aromatic amine compounds, for instance, esters of benzoquinone-1, 2-diazidosulfonic acid or naphthoquinone-1, 2-diazidosulfonic acid with polyhydroxyphenyl (hereinafter the term "ester" also include partial esters); esters of naphthoquinone-1, 2-diazido-4-sulfonic acid or naphthoquinone-1,2-diazido-5-sulfonic acid with pyrogallol/acetone resins; esters of benzoquinone-1, 2-diazidosulfonic acid or naphthoquinone-1,2-diazidosulfonic acid with novolak type phenol/formaldehyde resins or novalak type cresol/formaldehyde resins; amides of poly(p-aminostyrene) and naphthoquinone-1, 2-diazido-4-sulfonic acid or naphthoquinone-1,2-diazido-5-sulfonic acid; esters of poly (p-hydroxystyrene) and naphthoquinone-1,2- diazido-5-sulfonic acid; esters of polyethylene glycol with naphthoquinone-1, 2-diazido-4-sulfonic acid or naphthoquinone-1, 2-diazido 5-sulfonic acid: amides of polymeric amines with naphthoquinone-1, 2-diazido-4-sulfonic.

A particularly useful positive working composition comprises a triarylmethane dye, a triazine acid generator, 2,4 Naphthaquinone diazide sulphonic acid ester of a phenol resin.

This is hereinafter referred to as positive working photosensitive composition A.

An example of a developing solution used in both the first development step and second development step in the process of the present invention that is to say to remove the exposed positive photosensitive areas of the photosensitive composition after the first exposure are and after the second exposure is an aqueous solution of 8% metasilicate, 0.1% of an organic phosphite ester of an ethoxylated alcohol and 0.01% of polyoxy propylene methyl ethyl ammonium chloride. This is hereinafter referred to as Developing solution A.

In order to illustrate the various steps of the process of the present invention reference is made to the accompanying drawings.

FIGS. 1A–C, 2A–C, 3A–E, 4A–C and 5A–C show the steps in the preparation of a water-less lithographic plate from a presensitised lithographic plate.

In FIG. 1A the starting plate comprises the positive working photosensitive composition A or an aluminium plate.

In FIG. 1A there is coated on the grained oleophilic aluminium plate 1 the positive working photosensitive composition 2. Shown above the plate is a mask 3.

This plate is treated by the following steps, exposure through the mask 3, then developed in developing solution A. This development step removes the light exposed areas of the photosensitive composition 2. The developed plate is then coated overall wits siloxane coating composition A.

The siloxane coating is then heat cured at 110° C. for one minute.

Figure 1B:
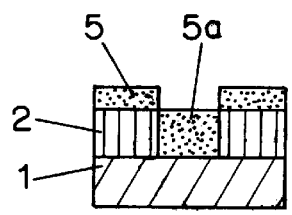

This yields the plate as shown in FIG. 1B, wherein 1 is the aluminium plate, 2 shows the photosensitive composition remaining after development and 5 shows the cured siloxane both on the remaining photosensitive composition 2 and directly coated on the plate 5a. The plate shown in 1B is then subjected to an overall visible light exposure and is then redeveloped in developing solution A. The resulting plate is as shown in FIG. 1C.

The grained oleophilic aluminium plate 1 has areas 1b with no coating thereon. On areas 1c it is coated with the cured siloxane coating 5.

Figure 1C:
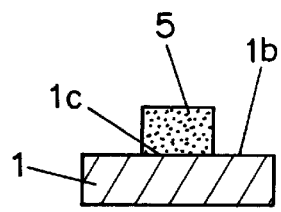

The plate shown in FIG. 1C can be inked up with an oleophilic ink which adheres to areas 1b of the aluminium plate but not to areas Ic which is coated with the cured siloxane 5. This inked up plate can be used as a water-less printing plate requiring no. fount solution.

In a small modification to the method described with reference to the plate of FIG. 1A. After the first development step the plate 1 was coated overall with silicone coated composition B which comprises a small proportion of poly-vinyl alcohol. This has the effect of making it easier to remove the siloxane coating 5 on the remaining photosensitive composition 2 in figure B but the siloxane in FIG. 1C was not affected.

Figure 2A:
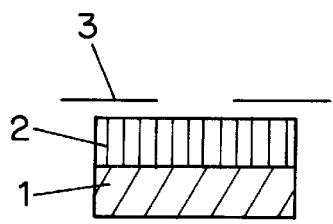

In FIG. 2A the plate comprising the same aluminium plate as used in FIG. 1 was coated with the same positive working coating composition 2 as used in FIG. 1.

Figure 2B:
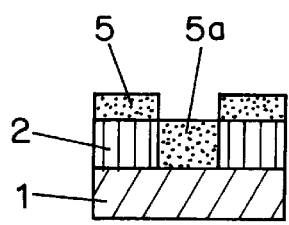

The plate of FIG. 2B was then exposed through mask 3, developed in developing solution A to remove the light exposed areas of the photosensitive composition 2. The developed plate was then coated overall with the fluoro coating composition C which is U.V. light curable.

Figure 2C:
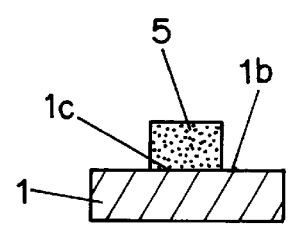

The plate was overall U.V. light exposed. This cures the fluoro coating composition and exposes the remaining photosensitive composition. The plate was then redeveloped in developing solution A. The resulting plate is as shown in FIG. 2C. The grained oleophilic aluminium plate has areas 1b with no coating thereon. On areas 1c it is coated with the U.V. light cured fluoro coating 5.

The plate shown in FIG. 2C can be inked up with an oleophilic ink which adheres to areas 1b of the aluminium plate but not to areas 1c which is coated with the cured fluoro composition 5. This inked up plate can be used as a water-less printing plate requiring no fount solution.

Figure 3A:
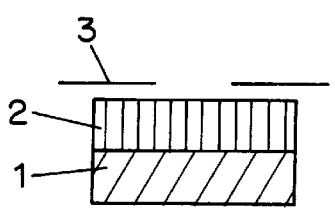

In FIG. 3A the plate comprising the same aluminium plate as used in FIG. 1 was coated with the same positive working coating composition 2 as used in FIG. 1.

Figure 3B:

The plate of FIG. 3A was then exposed through mask 3 and then developed in developing solution A to remove the light exposed areas of the photosensitive composition 2 as shown in FIG. 3B.

Figure 3C:
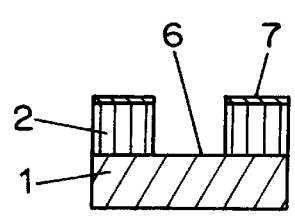

The developed plate was then coated overall with a Coconut fatty acid. This remained as a very thin layer 7 on the remaining photosensitive composition 2 but did not adhere to the uncovered plate 6 as shown in FIG. 3C.

Figure 3D:
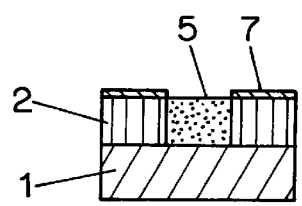

This plate was then coated overall with the fluoro-alkyl coating composition D shown as 5 and air dried at 120° C. for one minute as shown in FIG. 3D. The plate was then subjected to overall light exposure and was re-developed in developing solution A. The resulting plate is as shown in 3E. The grained aluminium plate 1 has areas 1b with no coating thereon and areas coated with the ink-releasing fluoro-alkyl coating 5.

Figure 3E:
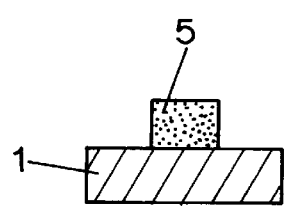

The plate shown in FIG. 3E can be inked up with an oleophilic ink which adheres to areas 1b of the aluminium plate but not on areas which are coated with the cured fluoro-alkyl 5. This inked up plate can be used as a water-less printing plate requiring no fount solution.

Figure 4A:
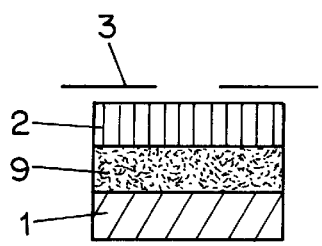
Figure 4B:
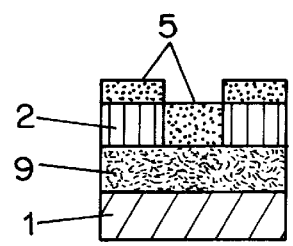
Figure 4C:
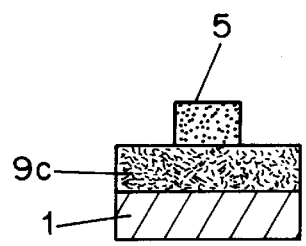

In FIG. 4A the plate comprising the same aluminium plate as used in FIG. 1 coated on this plate is a negative working coating composition 9 which comprised a triarylmethane dye, a condensation product of 4-diazodiphenylamine sulphate and formaldehyde (p-toluene sulphonic acid salt) and an epoxide resin.

Coated on the diazo resin 9 is the same positive working photosensitive composition A as used in FIG. 1 this is shown as 2. These coatings are shown in FIG. 4A.

The plate of FIG. 4A is then exposed through mask 3, to expose only the overlying positive coating, developed in developing solution A, thus the exposed areas of the positive photosensitive layer 2 are removed by the development step and overall coated with siloxane coating composition A shown as 5. The siloxane coating is then heat cured at 110° C. for 1 minute.

The plate of 4B is then overall light exposed and is redeveloped in developing solution A. This yields the plate shown in FIG. 4C. In this figure the plate 1 is coated overall with hardened diazo resin 9c. On the areas of the plate of FIG. 4C which were exposed in the first exposure step through the mask 3 is the cured siloxane resin 5. The areas of the plate not covered by the siloxane resin 5 comprise the photohardened diazo resin which is especially oleophilic. Thus the plate of FIG. 4C can be inked up and the oleophilic ink adheres extremely well to the areas 9c not covered with the siloxane and can be used as a water-less lithographic plate.

In FIG. 5A again the same aluminium plate is used. On this plate is coated a layer 12 of ethyl cellulose. This substance when dried forms an oleophilic layer. Coated on the ethyl cellulose layer 12 is a layer of positive working photosensitive resin. These coatings are shown in FIG. 5A.

Figure 5A:
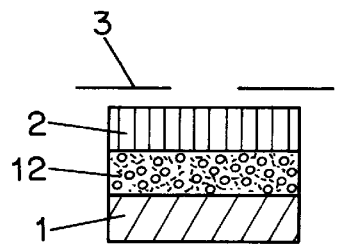
Figure 5B:
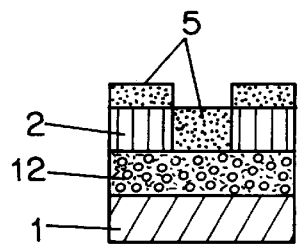
Figure 5C:
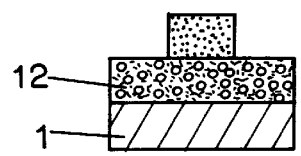

The plate in FIG. 5A is then exposed through mask 3, developed in developing solution A and overall coated ink siloxane coating composition A shown as 5 in FIG. 5B. The siloxane coating is then heat cured at 110° C. for 1 minute.

The plate of FIG. 5B is then overall light exposed and is redeveloped in developing solution A. This yields the plate shown in 5C. This plate can then be inked-up with a oleophic ink which adheres only to the ethyl cellulose layer 12. The ink does not adhere to the areas of ethyl cellulose coated by the silicone coating 5. Thus a water-less printing plate is produced.

Other oleophilic yielding layers can be used in the plate of FIG. 5A instead of ethyl cellulose.

After the redevelopment step all the plates prepared with reference to FIGS. 1 to 5 were dried and were then inked using a rubber roller and water-less plate ink. They were then placed in a printing press and in every case several thousand good prints were obtained.

What is claimed is:

1. A method of preparing a water-less lithographic plate comprising:

imagewise exposing for a first time a plate having a positive working photosensitive composition on an oleophilic base and developing the plate to remove the areas of the photosensitive composition which have been light exposed, coating overall the surface of the plate with a layer of a composition which is ink-releasing or when cured becomes ink releasing, then either as a separate step or as a combined step curing the ink-releasing composition or drying the ink-releasing composition and light exposing overall the plate a second time, then redeveloping the plate to remove the photosensitive composition remaining after the first development and the ink-releasing composition which overlaid the photosensitive composition, hereby providing a lithographic plate.

2. A method according to claim 1 which comprises the additional step between the developing step and the step of coating overall the plate with an ink releasing substance of treating the plate with an oleophilic coating composition which adheres to the remaining positive working composition but which does not adhere to the exposed base to form an optically light transparent coating having a thickness less than the thickness of the positive working composition on the remaining positive working composition.

3. A method according to claim 2 wherein the oleophilic coating composition comprises art ester based on coconut fatty acid.

4. A method according to claim 1 wherein the ink-releasing composition is heat curable.

5. A method according to claim 1 wherein the ink-releasing composition is ultraviolet curable.

6. A method according to claim 5 wherein a single exposure to ultraviolet light exposes the photosensitive composition and cures the ink-releasing composition.

7. A method according to claim 1 wherein the ink-releasing composition is dried before the plate is re-exposed.

8. A method according to claim 1 wherein the oleophilic base is an aluminium plate which has been physically or chemically treated to render it oleophilic.

9. A method according to claim 1 wherein the ink-releasing composition is either a silicone based polymer or a fluoroalkyl compound.

10. A method according to claim 1 wherein the ink-releasing composition comprises a water-soluble polymer.

11. A method according to claim 10 wherein the water-soluble polymer is polyvinyl alcohol or hydroxypropyl cellulose.

12. A method according to claim 1 wherein positive working photosensitive composition comprises an 0-quinone diazide compound.

13. A method according to claim 1 wherein there is present between the base plate and the positive working photosensitive composition an oleophilic layer to which the positive working photosensitive composition can adhere.

14. A method according to claim 13 wherein the oleophilic layer is a negative working plate.

15. A method according to claim 13 wherein the oleophilic layer is a layer of ethyl cellulose.

16. A method according to claim 1 wherein a curing inhibitor for the ink-releasing composition is present in the positive working photosensitive layer.

17. A method according to claim 16 wherein the curing inhibitor is hydroquinone.

18. A method according to claim 1 wherein the positive working photosensitive composition comprises at least one cellulosic compound.

19. A method of preparing a water-less lithographic plate by:

(a) imagewise exposing a first time a plate having a positive working photosensitive composition on an oleophilic base;

(b) developing the plate to remove the areas of the photosensitive composition which have been light exposed;

(c) treating the plate with an oleophilic coating composition which adheres to the remaining positive working composition but which does not adhere to the exposed base to form an optically light transparent coating having a thickness less than the thickness of the positive working composition on the remaining positive working composition;

(d) coating overall the surface of the plate with a layer of a composition which is ink-releasing or when cured becomes ink-releasing;

(e) either as a separate step or as a combined step curing the ink-releasing composition or drying the ink-releasing composition and light exposing overall the plate a second time; and (f) redeveloping the plate to remove the photosensitive composition remaining after the first development and the ink-releasing composition which overlaid the photosensitive composition.

20. A method according to claim 19 wherein the oleophilic coating composition comprises an ester based on coconut fatty acid.

21. A method according to claim 19 wherein the oleophilic base is an aluminum plate which has been physically or chemically treated to render it oleophilic.

22. A method according to claim 19 wherein the ink-releasing composition is either a silicone-based polymer or a fluoroalkyl compound.

23. A method according to claim 19 wherein the ink-releasing composition comprises a proportion of a water-soluble polymer which is polyvinyl alcohol or hydroxypropyl cellulose.

24. A method according to claim 19 wherein there is present between the base plate and the positive working photosensitive composition an oleophilic layer of ethyl cellulose to which the positive working photosensitive composition can adhere.

25. A method according to claim 19 wherein the positive working photosensitive composition comprises at least one cellulosic compound.

26. A method of printing using a water-less lithographic plate comprising:

(a) providing a lithographic plate obtained by (i) imagewise exposing for a first time a plate having positive working photosensitive composition on an oleophilic base, (ii) developing the plate to remove the areas of the photosensitive composition which have been light exposed, (iii) coating overall the surface of the plate with a layer of a composition which is ink-releasing or when cured becomes ink releasing, (iv) either as a separate step or as a combined step curing the ink-releasing composition or drying the ink-releasing composition and light exposing overall the plate a second time, and (v) redeveloping the plate to remove the photosensitive composition remaining after the first development and the ink-releasing composition which overlaid the photosensitive composition;

(b) inking the plate; and (c) contacting, the plate with a printable medium.

27. A method of preparing a water-less lithographic plate comprising:

(a) imagewise exposing for a first time a plate having a positive working sensitive composition on an oleophilic base selected from the group consisting of aluminum, plastic and treated paper;

(b) developing the plate to remove the areas of the photosensitive composition which have been light exposed;

(c) coating overall the surface of the plate with a layer of a composition which is ink-releasing or when cured becomes ink releasing;

(d) either as a separate step or as a combined step curing the ink-releasing composition or drying the ink-releasing composition and light exposing overall the plate a second time; and (e) redeveloping the plate to remove the photosensitive composition remaining after the first development and the ink-releasing composition which overlaid the photosensitive composition, thereby providing a lithographic plate.

28. A method of printing using a water-less lithographic plate comprising:

(a) providing a lithographic plate prepared by (i) imagewise exposing for a first time a plate having a positive working photosensitive composition on an oleophilic base selected from the group consisting of aluminum, plastic and treated paper, (ii) developing the plate to remove the areas of the photosensitive composition which have been light exposed, (iii) coating overall the surface of the plate with a layer of a composition which is ink-releasing or when cured becomes ink releasing, (iv) either as a separate step or as a combined step curing the ink-releasing composition or drying the ink-releasing composition and light exposing overall the plate a second time, and (v) redeveloping the plate to remove the photosensitive composition remaining after the first development and the ink-releasing composition which overlaid the photosensitive composition;

(b) inking the plate; and (c) contacting the plate with a printable medium.

* * * * *

UNITED STATES PATENT AND TRADEMARK OFFICE
CERTIFICATE OF CORRECTION

PATENT NO.   : 6,087,073
DATED        : July 11, 2000
INVENTOR(S)  : Bennett et al.

It is certified that error appears in the above-identified patent and that said Letters Patent is hereby corrected as shown below:

Title page,
Item [75] Inventors: "Harrogate," should read -- Yorkshire, --; and "Morley," should read -- Leeds, --

Column 2,
Line 62, " -aminopropyltrimethoxysilane" should read -- -aminopropyltrimethoxysilane --
Line 64, " -aminopropyltrimethoxysilane" should read -- -aminopropyltrimethoxysilane --

Column 3,
Line 36, "freight" should read -- weight --
Line 54, "comprise" should read -- comprises --

Column 4,
Line 65, "include" should read -- includes --

Column 5,
Line 4, "novalak" should read -- novolak --
Line 16, "Naphthaquinone" should read -- naphthaquinone --
Line 24, "are" should be deleted
Line 61, "lc" should read -- 1c --; and "is" should read -- are --
Line 63, "no." should read -- no --
Line 65, "FIG. 1A. After" should read -- FIG. 1A, after --

Column 6,
Line 22, "is" should read -- are --
Line 33, "Coconut" should read -- coconut --

Column 7,
Line 20, "oleophic" should read -- oleophilic --

UNITED STATES PATENT AND TRADEMARK OFFICE
CERTIFICATE OF CORRECTION

PATENT NO.   : 6,087,073
DATED        : July 11, 2000
INVENTOR(S)  : Bennett et al.

It is certified that error appears in the above-identified patent and that said Letters Patent is hereby corrected as shown below:

Claims,
Column 7,
Line 47, "hereby" should read -- thereby --
Line 59, "art" should read -- an --

Column 8,
Line 4, "aluminium" should read -- aluminum --
Line 13, "wherein positive" should read -- wherein the positive --

Column 9,
Line 2, "a proportion of" should be deleted
Line 16, "having positive" should read -- having a positive --
Line 32, "contacting," should read -- contacting --

Signed and Sealed this

Thirteenth Day of November, 2001

*Attest:*

NICHOLAS P. GODICI
*Attesting Officer*   Acting Director of the United States Patent and Trademark Office